(12) United States Patent
Shakuda

(10) Patent No.: US 6,238,947 B1
(45) Date of Patent: May 29, 2001

(54) SEMICONDUCTOR LIGHT-EMITTING DEVICE AND METHOD OF FABRICATING THE SAME

(75) Inventor: Yukio Shakuda, Kyoto (JP)

(73) Assignee: Rohm Co., Ltd., Kyoto (JP)

(*) Notice: Subject to any disclaimer, the term of this patent is extended or adjusted under 35 U.S.C. 154(b) by 0 days.

(21) Appl. No.: 09/465,400

(22) Filed: Dec. 17, 1999

Related U.S. Application Data

(62) Division of application No. 08/859,707, filed on May 21, 1997, now Pat. No. 6,072,819.

(30) Foreign Application Priority Data

May 23, 1996 (JP) .................................................. 8-128187

(51) Int. Cl.[7] .................................................. H01L 21/00
(52) U.S. Cl. .................................. 438/94; 257/46; 438/22
(58) Field of Search .................................. 438/46, 22, 45, 438/47, 503, 504, 505; 257/190, 76, 96, 97, 103, 94, 102, 607, 742, 13, 86; 372/45, 46

(56) References Cited

U.S. PATENT DOCUMENTS

| | | |
|---|---|---|
| 5,268,328 | 12/1993 | Mori et al. . |
| 5,583,880 | 12/1996 | Shakuda . |
| 5,585,649 | 12/1996 | Ishikawa et al. . |
| 5,587,335 | 12/1996 | Mori et al. . |
| 5,689,123 * | 11/1997 | Major et al. .................... 257/190 |
| 5,732,098 | 3/1998 | Nistani et al. . |
| 5,740,192 | 4/1998 | Hatano et al. . |
| 5,985,687 * | 11/1999 | Bowers et al. .................... 436/46 |
| 6,087,681 * | 7/2000 | Shakuda .................... 257/103 |

* cited by examiner

Primary Examiner—Matthew Smith
Assistant Examiner—Calvin Lee
(74) Attorney, Agent, or Firm—Arent Fox Kintner Plotkin & Kahn, PLLC

(57) ABSTRACT

A structure consisting of a substrate and a gallium nitride based compound semiconductor formed on the substrate, includes: a light-emitting layer forming portion consisting at least of a semiconductor layer of a first conductivity type (an n-type cladding layer) and a semiconductor layer of a second conductivity type (a p-type cladding layer); a current blocking layer of the first conductivity type, which is formed within a semiconductor layer of the second conductivity type and in close proximity to the light-emitting layer forming portion, and a portion of which is removed in a region where a current flows; and electrodes connected to the semiconductor layer of the first conductivity type and the semiconductor layer of the second conductivity type, respectively. In a semiconductor light-emitting device using GaN based compound semiconductors, this structure allows the current blocking layer for defining a current injection region to be formed in close proximity to the light-emitting layer, thus reducing leakage current into regions outside a pattern.

3 Claims, 5 Drawing Sheets

FIG. 3 (a) PRIOR ART
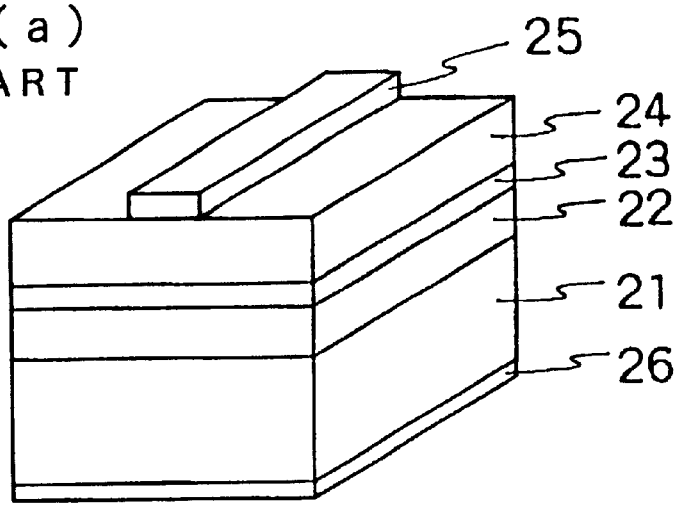
FIG. 3 (b) PRIOR ART
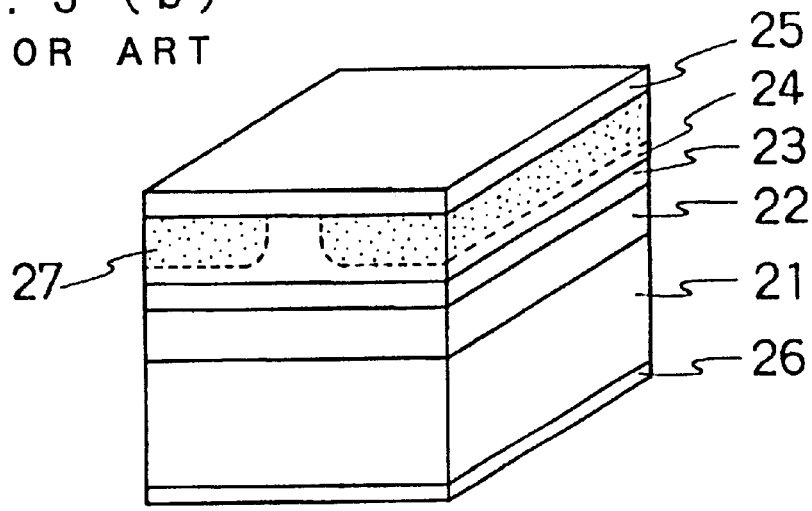
FIG. 3 (c) PRIOR ART
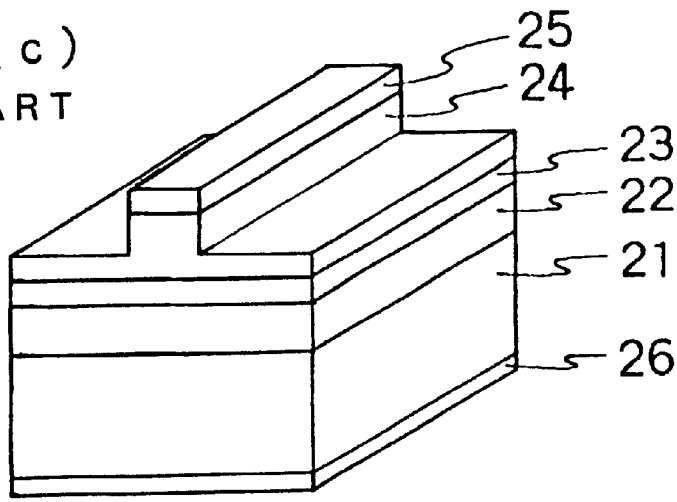

SEMICONDUCTOR LIGHT-EMITTING DEVICE AND METHOD OF FABRICATING THE SAME

This is a divisional application of Ser. No. 08/859,707 filed May 21, 1997 now U.S. Pat. No. 6,072,819.

BACKGROUND OF THE INVENTION

The present invention relates to a semiconductor light-emitting device such as a semiconductor laser using a gallium nitride (GaN) based compound semiconductor, and a method of fabricating the same. More particularly, the invention relates to a semiconductor light-emitting device in which a current blocking layer for ensuring precise current injection only into the desired light-emitting region is formed in close proximity to a light-emitting layer, and a method of fabricating the same.

Techniques have been widespread for fabricating light-emitting devices, such as semiconductor lasers emitting red or infrared laser light by using GaAs or AlGaInP based compound semiconductors. On the other hand, there has been a demand for semiconductor light-emitting devices that would emit blue light of a shorter wavelength; using GaN based compound semiconductors, it has now become possible to produce light-emitting diodes that emit blue light, and blue semiconductor lasers also are currently under development.

As for semiconductor laser structures, gain waveguide structures such as shown in FIGS. 3(a) to 3(c) have been considered for semiconductor lasers. That is, in the structure of FIG. 3(a), the upper (p-side) electrode 25 is patterned and the current injection region is restricted to a narrow region under the electrode pattern; in the structure of FIG. 3(b), protons or the like are bombarded on both sides of the current injection region to form high-resistivity regions defining the current injection region; in the structure of FIG. 3(c), both sides of the current injection region are etched away by dry etching, etc. to produce a mesa structure. In each of FIGS. 3(a) to 3(c), reference numeral 21 is, for example, an n-type GaAs substrate, on top of which an n-type cladding layer 22, an active layer 23, and a p-type cladding layer 24 are formed one above another to form a double-heterojunction structure semiconductor laser; 25 is a p-side electrode, 26 is an n-side electrode, and 27 is a proton bombarded region.

However, with the electrode pattern alone, it is not possible to perfectly define the current injection region, and much current is wasted. On the other hand, with the method of forming high-resistivity regions surrounding the current injection region, not only equipment cost is high but the depth of the high-resistivity regions cannot be controlled with good accuracy. Further, with the method of forming a mesa by etching, since GaN based compound semiconductor layers cannot be etched with good accuracy, the etching depth to form the mesa varies, causing variations in emission characteristics. Moreover, in any of these methods, since the electrode pattern and high-resistivity regions for defining the current injection regions, and the etched portions for forming the mesa, are formed in locations separated from the light-emitting layer, the region that actually leads to the light-emitting layer spreads beyond the current injection region, resulting in much leakage current and thus reducing the emission efficiency.

On the other hand, there is a demand for a semiconductor laser of a refractive index waveguide structure in which a current blocking layer of the opposite conductivity type to that of a light confinement layer is formed within the light confinement layer, with a stripe formed in the current blocking layer to define the current injection region. One method considered for making a semiconductor laser of this structure using GaN based compound semiconductor layers is as follows. That is, as shown in FIG. 4(a), GaN based compound semiconductor layers consisting of an n-type buffer layer 2, an n-type cladding layer 3, an active layer 4, and a p-type cladding layer 5, and a current blocking layer 7 of n-type GaN are epitaxially grown one above another, for example, on top of a sapphire substrate 1 by using MOCVD (metal-organic chemical vapor deposition) equipment. Here, the n-type cladding layer 3, the active layer 4, and the p-type cladding layer 5 together constitute a light-emitting layer forming portion 14. Thereafter, as shown in FIG. 4(b), the current blocking layer 7 is etched to form a stripe recess 17, after which a semiconductor layer is epitaxially grown again by using the MOCVD equipment. Since these semiconductor layers usually contain gaseous nitrogen among their constituent components, they are often grown epitaxially by using MOCVD equipment.

However, as earlier mentioned, the etching of the GaN based compound semiconductor layers cannot be controlled with good accuracy. The etching proceeds not only into the current blocking layer 7 but also into the light-emitting layer forming portion 14 such as the p-type cladding layer 5 and the active layer 4, damaging the light-emitting layer forming portion 14 and degrading the emission characteristics. Conversely, if the etching is insufficient, the current blocking layer 7 of the opposite conductivity type remains unetched, as a result of which the current does not flow and emission cannot be achieved. With the above structure, therefore, semiconductor lasers with stable characteristics cannot be obtained, and no commercial implementations are available yet. Moreover, when the substrate with epitaxially grown layers is taken out the MOCVD equipment for etching or other processing, Ga in the GaN based compound semiconductor layers is oxidized, thus contaminating the surface. The problem is that this degrades the quality of epitaxial growth of GaN based compound semiconductor layers in subsequent processing.

For semiconductor lasers using GaAs based compound semiconductors, on the other hand, there is sometimes employed a method in which after forming a current blocking layer a stripe groove is etched, followed again by epitaxial growth of a semiconductor layer. In GaAs based compound semiconductors also, if Al is contained, oxidation can easily occur when exposed to air; in this case, a method may be employed in which after the etching, thermal etching is performed in an epitaxial growth furnace to evaporate part of the semiconductor layers for cleaning of the surface, and then epitaxial growth is performed. For GaAs based compound semiconductors, since MBE (molecular beam epitaxy) equipment is usually used for epitaxial growth, thermal etching can be performed by evacuating the equipment to a vacuum, so that precise etching only of the current blocking layer of GaAs can be accomplished. For GaN based compound semiconductors, on the other hand, since gaseous nitrogen is contained among their constituent elements, epitaxial growth is often performed by an MOCVD process using MOCVD equipment. However, in the case of MOCVD equipment, the degree of vacuum cannot be raised, and thermal etching cannot be performed as precisely as for GaAs based compound semiconductors. More specifically, a high degree of vacuum would facilitate evaporation of GaN and make etching control possible, but since the degree of vacuum cannot be raised, GaN does not easily evaporate and, hence, etching control is difficult.

In this way, in semiconductor light-emitting devices using GaN based compound semiconductors, since etching cannot be controlled with good accuracy, the current injection region cannot be accurately defined in close proximity to (within a distance of 0.1 to 1 µm from) the light-emitting layer. The resulting problem is that much current is wasted, making it impossible to improve the emission efficiency.

Furthermore, as described above, MOCVD equipment cannot be evacuated to a high degree of vacuum, and the device surface cannot be cleaned in the equipment where semiconductor layers are grown. This leads to the problem that once the semiconductor layer structure is taken out the MOCVD equipment for etching or other processing, a GaN based compound semiconductor layer of high quality cannot be epitaxially grown on top of it in the MOCVD equipment, and as a result, semiconductor light-emitting devices, such as semiconductor lasers having stripe grooves and light-emitting diodes with well-defined light-emitting regions, cannot be obtained.

SUMMARY OF THE INVENTION

The present invention has been devised to solve the above-enumerated problems, and it is an object of the invention to provide a semiconductor light-emitting device that permits etching of GaN based compound semiconductor layers in MOCVD equipment and that allows the formation near a light-emitting layer of a current blocking layer for defining a current injection region which requires an etching process during the process of epitaxial growth of GaN based compound semiconductor layers.

Another object of the present invention is to provide a semiconductor light-emitting device in which etching depth is accurately controlled by utilizing differences in etching rate arising from differences in semiconductor layer composition.

A further object of the present invention is to provide a method for the fabrication of such a semiconductor light-emitting device.

To obtain a semiconductor light-emitting device having a current blocking layer with a stripe groove or the like formed therein by precisely etching GaN based compound semiconductor layers in MOCVD equipment, and capable of highly efficient light emission by confining a current within the necessary current injection region, the present inventor has conducted vigorous study and found that the speed at which etching proceeds through the GaN based compound semiconductor layers can be regulated without evacuating the MOCVD equipment to a high vacuum but by using hydrogen as an atmosphere gas, adding an ammonia gas to it, and heating the substrate while controlling the gas quantity, and the etching rate between semiconductor layers of different crystal mixing ratios can thus be controlled. As a result, a semiconductor laser having an accurately defined stripe formed in the current blocking layer in the GaN based compound semiconductor layers, as well as a light-emitting diode with leakage current and wasted current reduced by preventing current from flowing to unnecessary regions of the device, has been obtained.

The semiconductor light-emitting device of the present invention is fabricated from a gallium nitride based compound semiconductor formed on a substrate, and comprises: a light-emitting layer forming portion comprising at least of a semiconductor layer of a first conductivity type and a semiconductor layer of a second conductivity type; a current blocking layer of the first conductivity type, which is formed within a semiconductor layer of the second conductivity type and in close proximity to the light-emitting layer forming portion, and a portion of which is removed in a region where a current flows; and electrodes electrically connected to the semiconductor layers of the first and second conductivity types, respectively.

The gallium nitride (GaN) based compound semiconductor here means a semiconductor consisting of a compound of Ga, an element from group III, and N, an element from group V, or a compound with similar composition except that part of the group III element Ga is replaced by another group III element such as Al or In and/or part of the group V element N is replaced by another group V element such as P or As.

The term light-emitting layer forming portion used here refers to a structure consisting of multiple semiconductor layer formed one on top of another and contributing to light emission; in the case of the structure in which the active layer is sandwiched between an n-type cladding layer and a p-type cladding layer, the term refers to these three layers, and in the case of the structure in which light emission takes place at the junction between an n-type layer and a p-type layer, the term refers to the layers on both sides of the junction.

Preferably, an etching stop layer formed from a material having a small etching rate during the thermal etching of the current blocking layer is provided between the current blocking layer and the light-emitting layer forming portion. The provision of the etching stop layer enables etched region depth to be controlled reliability at the surface of the etching stop layer, achieving precise etching neither excessive nor insufficient.

The semiconductor laser of the present invention comprises: layers sequentially grown on top of a substrate, the layers including a cladding layer of a first conductivity type, an active layer, a cladding layer of a second conductivity type formed from a gallium nitride based compound semiconductor respectively, an etching stop layer formed from a gallium nitride based compound semiconductor containing Al, a current blocking layer of the first conductivity type formed from GaN and in which a stripe groove is formed, a protective layer formed from a gallium nitride based compound semiconductor containing Al and in which the stripe groove is formed, and a light confinement layer of the second conductivity type formed from a gallium nitride based compound semiconductor; and electrodes electrically connected to the semiconductor layers of the first and second conductivity types, respectively.

The light-emitting diode of the present invention comprises: a substrate; a light-emitting layer forming portion formed from a gallium nitride based compound semiconductor deposited upon the substrate; a current blocking layer formed around a periphery of the light-emitting layer forming portion and formed from GaN of a conductivity type different from the conductivity type of an uppermost layer of the light-emitting layer forming portion; a current diffusing layer formed above the light-emitting layer forming portion exposed through a removed center portion of the current blocking layer, as well as on top of the current blocking layer remaining in areas surrounding the removed center portion; and electrodes electrically connected to a semiconductor layer of a first conductivity type and a semiconductor layer of a second conductivity type, respectively, in the light-emitting layer forming portion. In this case, if the current blocking layer is also formed in a portion directly below the electrode formed on an upper surface side of the multiple semiconductor layer structure, unnecessary light emission from the regions covered by the electrode can be prevented, and the emission efficiency improves.

The method for semiconductor light-emitting device fabrication according to the present invention comprises:

(a) epitaxially growing, one above another on a substrate, a light-emitting layer forming portion formed from a gallium nitride based compound semiconductor and including a semiconductor layer of a first conductivity type and a semiconductor layer of a second conductivity type, an etching stop layer of the second conductivity type formed from a gallium nitride based compound semiconductor containing Al, a current blocking layer of the first conductivity type formed from GaN, and a protective layer formed from a gallium nitride based compound semiconductor containing Al;

(b) etching the protective layer and the current blocking layer and thereby forming a recessed portion defining a light-emitting region through the protective layer and through a portion of the current blocking layer in a depthwise direction thereof;

(c) exposing the etching stop layer by thermally etching portions of the current blocking layer remaining in the recessed portion in an atmosphere containing hydrogen and ammonia gases in a growth furnace used for epitaxial growth of semiconductor layers;

(d) then epitaxially growing a semiconductor layer of the second conductivity type formed from a gallium nitride based compound semiconductor; and (e) forming electrodes electrically connected to the semiconductor layers of the first and second conductivity types, respectively.

From the viewpoint of improving etching rate controllability, it is desirable to add a nitrogen gas as an atmosphere gas during the thermal etching. Also preferably, a second protective layer formed from GaN is formed on top of a surface of the protective layer, and the second protective layer is thermally etched during the thermal etching of the current blocking layer. This provides a clean semiconductor layer surface on which to further deposit a semiconductor layer, and thus serves to enhance the characteristics of the semiconductor light-emitting device.

BRIEF DESCRIPTION OF THE DRAWINGS

FIGS. 3(a) to 3(c) are diagrams showing structures considered for semiconductor lasers using GaN based compound semiconductors.

DETAILED DESCRIPTION

A semiconductor light-emitting device and a method for its fabrication according to the present invention will be described below with reference to drawings.

Figure 1:
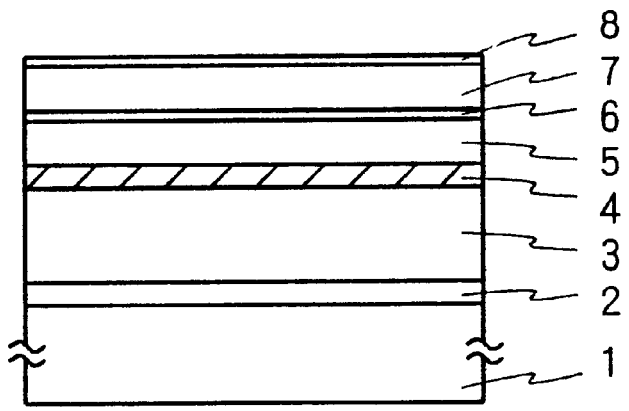
FIGS. 1(a) to 1(e) are diagrams illustrating a fabrication process for a semiconductor laser according to one embodiment of the present invention.
Figure 1:
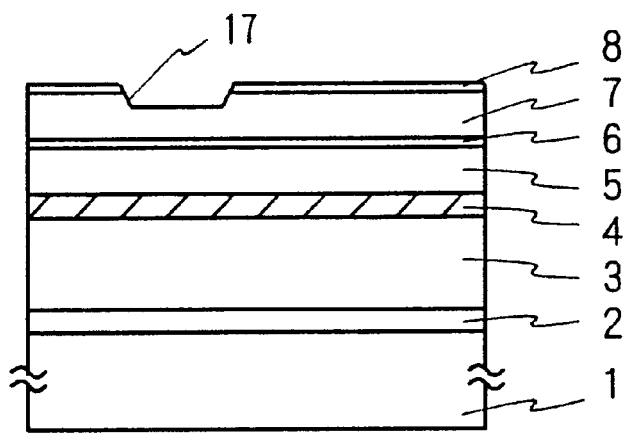
Figure 1:
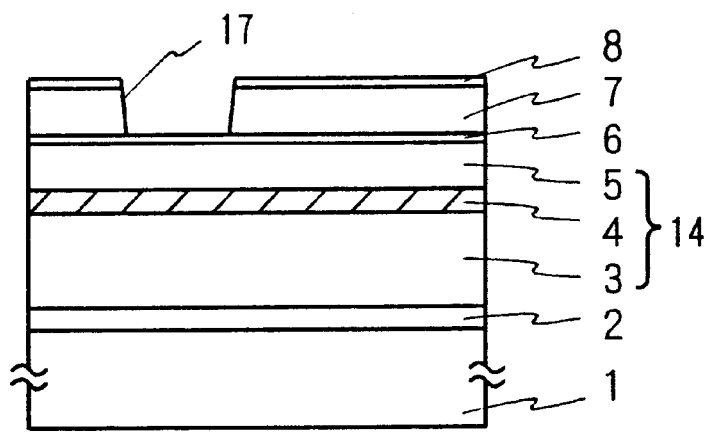
Figure 1:
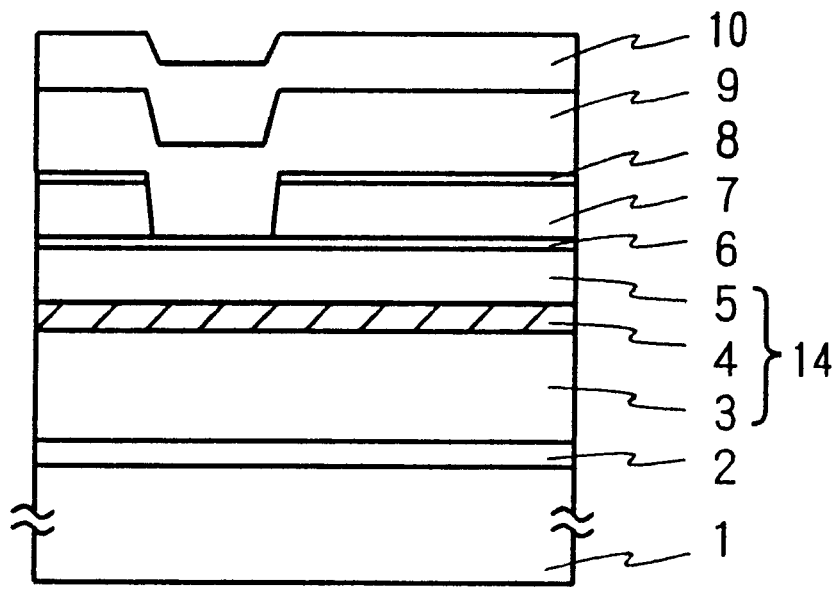
Figure 1:
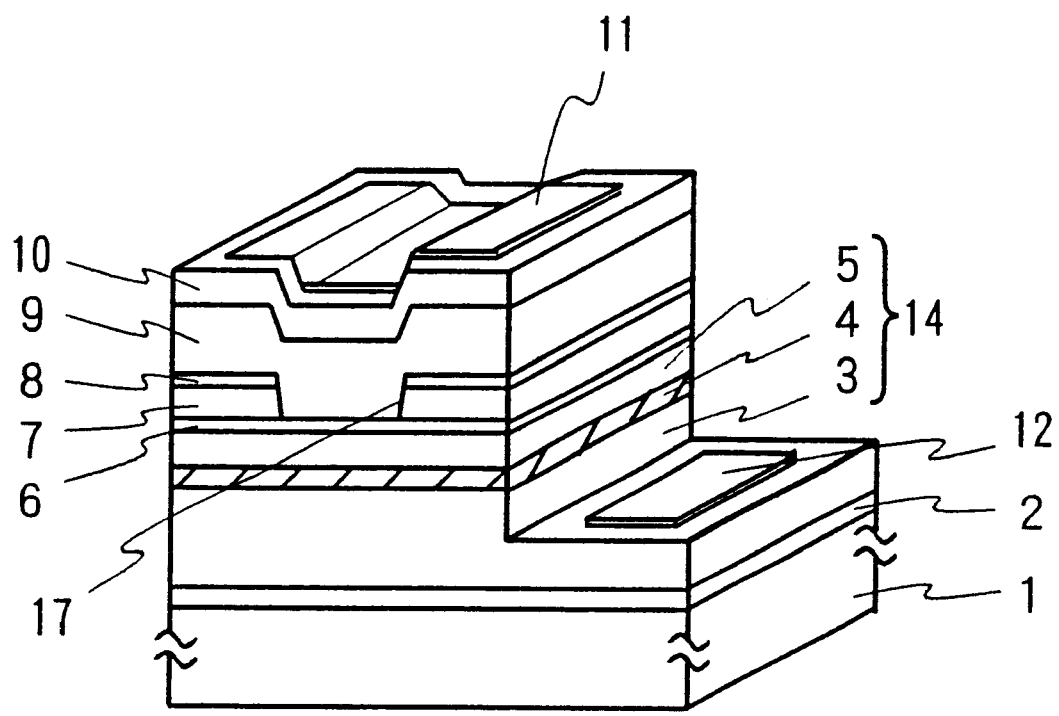

As shown in the perspective view of FIG. 1(e) illustrating one embodiment of the present invention, the semiconductor light-emitting device of the present invention is fabricated from gallium nitride based compound semiconductors formed on a substrate 1, and comprises a light-emitting layer forming portion 14 consisting at least of a semiconductor layer of a first conductivity type (n-type cladding layer 3), an active layer 4 and a semiconductor layer of a second conductivity type (p-type cladding layer 5), a current blocking layer 7 of the first conductivity type which is formed within a semiconductor layer of the second conductivity type and in close proximity to the light-emitting layer forming portion 14, and a portion of which is removed in a region where a current flows, and electrodes 11 and 12 electrically connected to the semiconductor layers of the first and second conductivity types, respectively.

That is, the semiconductor light-emitting device of the present invention is characterized in that the current blocking layer 7 of the conductivity type different from that of the surrounding regions is formed with good accuracy despite the use of gallium nitride based compound semiconductors. In this case, it is desirable that an etching stop layer 6, having a small etching rate against the thermal etching of the current blocking layer 7, is formed between the current blocking layer 7 and the light-emitting layer forming portion 14, because the depth of the etched region can then be controlled reliably at the surface of the etching stop layer. Next, a detailed description will be given of the structure of such a semiconductor light-emitting device and a method of fabricating the same.

First, as shown in FIG. 1(a), a low-temperature buffer layer 2 of GaN or $IN_xGa_{1-x}N$ ($0 \leq x \leq 1$), an n-type cladding layer 3 of GaN or $In_xAl_yGa_{1-x-y}N$ ($0 \leq x \leq 1$, $0 \leq y \leq 1$, $0 \leq x+y \leq 1$), an active layer 4 of $In_zGa_{1-z}N$ ($0 \leq z \leq 1$), a p-type cladding layer 5 of p-type GaN or $In_xAl_yGa_{1-x-y}N$, an etching stop layer 6 of p-type $Al_aGa_{1-a}N$ ($0.02 \leq a \leq 1$), a current blocking layer 7 of n-type GaN, and a protective layer 8 of n- or p-type $Al_aGa_{1-a}N$ ($0.02 \leq a \leq 1$) are epitaxially grown one above another on top of a sapphire (single-crystal $Al_2O_3$) substrate 1 in MOCVD equipment. The active layer 4 and the n-type and p-type cladding layers 3 and 5 together constitute the light-emitting layer forming portion 14. A second protective layer of GaN (not shown) may be deposited on top of the above structure. The provision of the second protective layer of GaN allows thermal etching to be performed over the entire surface of the epitaxially grown semiconductor layer, so that contaminated portions other than the stripe groove can also be cleaned when performing epitaxial growth again after etching. This is preferable because it allows the formation of a high-quality semiconductor layer on top of the surface. Since the protective layer 8 and the second protective layer can each be made as thin as 0.5 μm or less, control of subsequent dry etching is easy.

Next, as shown in FIG. 1(b), by masking and dry etching, etc. using photolithography, the protective layer 8 and a portion of the current blocking layer 7 are etched to form a recessed portion 17 which is the stripe groove. The dry etching is performed in an atmosphere of argon gas and chlorine gas in which part of the argon gas is ionized and subjected to acceleration voltage to bombard a wafer with ions. At this time, the etching depth cannot be controlled accurately, but if the etching depth of the current blocking layer 7 is not accurate, it suffices for the purpose if the current blocking layer 7 is etched so that a portion thereof remains unetched.

Next, as shown in FIG. 1(c), the above structure is placed in MOCVD equipment or epitaxial a growth equipment for epitaxial growth of semiconductor layers, and is heated to 900 to 1200° C. in an atmosphere consisting of nitrogen ($N_2$), hydrogen ($H_2$), and ammonia ($NH_3$) gases. In this gas mixture, by setting $H_2:NH_3$ to 2:1 to 5:1 when $N_2$ is 0, or by setting $H_2:NH_3:N_2$ to 1:1:1 to 10:1:1, only the GaN layer is etched, while the etching stop layer 6 consisting of $Al_aGa_{1-a}N$ containing Al is little etched because of its small etching rate. As a result, the portion of the current blocking layer 7 remaining under the recessed portion 17 formed in the preceding dry etching step is etched away in a stripe pattern, exposing the etching stop layer 6, and evaporation of the semiconductor layer stops. If the second protective layer of GaN (not shown) is previously formed on top of the protective layer 8, during the above thermal etching process the second protective layer is also etched to expose the protective layer 8 of $Al_aGa_{1-a}N$, thus accomplishing the cleaning of the entire surface. In this thermal etching, if the proportion of $NH_3$ is increased, the etching rate of the GaN based compound semiconductors decreases, and if the proportion of $NH_3$ is reduced, the etching rate increases; in this way, the etching can be controlled. Furthermore, if $N_2$ is mixed into the atmosphere gas, the etching of the GaN based compound semiconductors can be suppressed as in the case of $NH_3$ and by increasing its quantity, the etching rate decreases, thus accomplishing etching control in like manner.

Next, in the same equipment, for example, MOCVD equipment, in which the current blocking layer 7 was thermally etched, a light confinement layer 9 of p-type $Al_aGa_{1-a}N$ and a contact layer 10 of p-type GaN are sequentially grown by epitaxy, as shown in FIG. 1(d).

Next, as shown in FIG. 1(e), a portion of the multiple semiconductor layer structure is etched away to expose the n-type cladding layer 3 or the buffer layer 2, and a p-side electrode 11 and an n-side electrode 12 are formed by metal evaporation or the like.

Next, the method for the fabrication of the above semiconductor laser will be described in further detail by way of specific example.

First, the sapphire substrate 1 is set inside the MOCVD equipment, and while holding the substrate temperature at 400 to 800° C., trimethyl gallium (TMG) at 1 to 100 cc/minute, ammonia ($NH_3$) at 1 to 30 liters/min., hydrogen ($H_2$) at 10 to 20 liters/minute, nitrogen ($N_2$) at 0 to 20 liters/minute are introduced for reaction for 5 to 60 minutes, thereby growing the buffer layer 2 of GaN to a thickness of about 0.01 to 0.5 µm.

Then, the temperature in the equipment is raised to heat the substrate to 800 to 1200° C., and silane ($SiH_4$) at 100 ppm in $H_2$ is introduced into the above gas atmosphere at a flow rate of 1 to 100 cc/minute, thereby growing the n-type cladding layer 3 of n-type GaN to a thickness of about 0.5 to 5 µm. Here, if a cladding layer of $Al_{0.1}Ga_{0.9}N$ is to be grown instead of the GaN layer, trimethyl aluminum (TMA) is introduced into the above gas atmosphere at a flow rate of 1 to 100 cc/minute.

Next, while holding the substrate temperature at 600 to 1000° C., TMG at 1 to 100 cc/minute, trimethyl indium (TMIn) at 1 to 1000 cc/minute, $NH_3$ at 1 to 30 liters/minute, $H_2$ and $N_2$ each at 0 to 20 liters/minute, and either or neither 100 ppm $SiH_4$ at 0 to 100 cc/minute or dimethyl zinc (DMZn) at 0 to 500 cc/minute are introduced, to form the active layer 4 of undoped or n- or p-type $In_{0.1}Ga_{0.9}N$ to a thickness of about 0.05 to 0.3 µm.

Next, using the same condition as for the n-type cladding layer 3, biscyclopentadienyl magnesium ($Cp_2Mg$) instead of $SiH_4$ as the doping gas is introduced at a flow rate of 1 to 1000 cc/minute, to grow the p-type cladding layer 5 of p-type GaN to a thickness of about 0.1 to 1 µm. Here, if $Al_{0.1}Ga_{0.9}N$ is to be grown instead of GaN, TMA is introduced at a flow rate of 1 to 1000 cc/minute, as previously described.

Then, while holding temperature of the substrate lat 800 to 1200° C., TMA is introduced at a flow rate of 1 to 1000 cc/minute, to grow the p-type etching stop layer 6 of $Al_{0.1}Ga_{0.9}N$ to a thickness of about 0.05 to 0.5 µm. Here, if the p-type cladding layer 5 is formed from $Al_{0.1}Ga_{0.9}N$, the p-type cladding layer 5 can also be used as the etching stop layer. Using the same conditions as for the n-type cladding layer 3, etc., the current blocking layer 7 of n-type GaN with a thickness of about 0.1 to 1 µm, the protective layer 8 of $Al_{0.1}Ga_{0.9}N$ with a thickness of about 0.05 to 0.5 µm, and the second protective layer of GaN with a thickness of about 0.01 to 0.1 µm are sequentially grown.

Next, the substrate with the semiconductor layers epitaxially grown thereon is taken out the MOCVD equipment, and resist film is applied and then patterned to remove the resist film in the form of a stripe. Thereafter, the substrate is placed in the dry etching apparatus for etching by ionized gas, where argon (Ar) at 4 cc/minute and chlorine ($Cl_2$) at 4 cc/minute are introduced and an ion beam is bombarded at an acceleration voltage of 1 to 25 kV to achieve etching in a stripe pattern. This etching is performed to a depth of about 0.1 to 1 µm so that the protective layer 8 is completely etched through while the current blocking layer 7 is partially etched.

Thereafter, the substrate is again placed in the MOCVD equipment, and the equipment temperature is raised so that the substrate is heated to 800 to 1200° C. Then, gases of TMA, TMG, and $Cp_2Mg$ are introduced in the same manner as previously described, to grow the p-type light confinement layer 9 of $Al_{0.1}Ga_{0.9}N$ to a thickness of about 0.1 to 3 µm. Further, while maintaining the same temperature, gases of MTG and $Cp_2Mg$ are introduced in the same manner as previously described, to grow the contact layer 10 of p-type GaN to a thickness of about 0.1 to 3 µm.

Thereafter, Ti and Al are simultaneously evaporated to form the p-side electrode 11, and Ni and Au are simultaneously evaporated to form the n-side electrode 12, thus completing the formation of the electrodes 11 and 12 made of the respective alloys.

Figure 2:
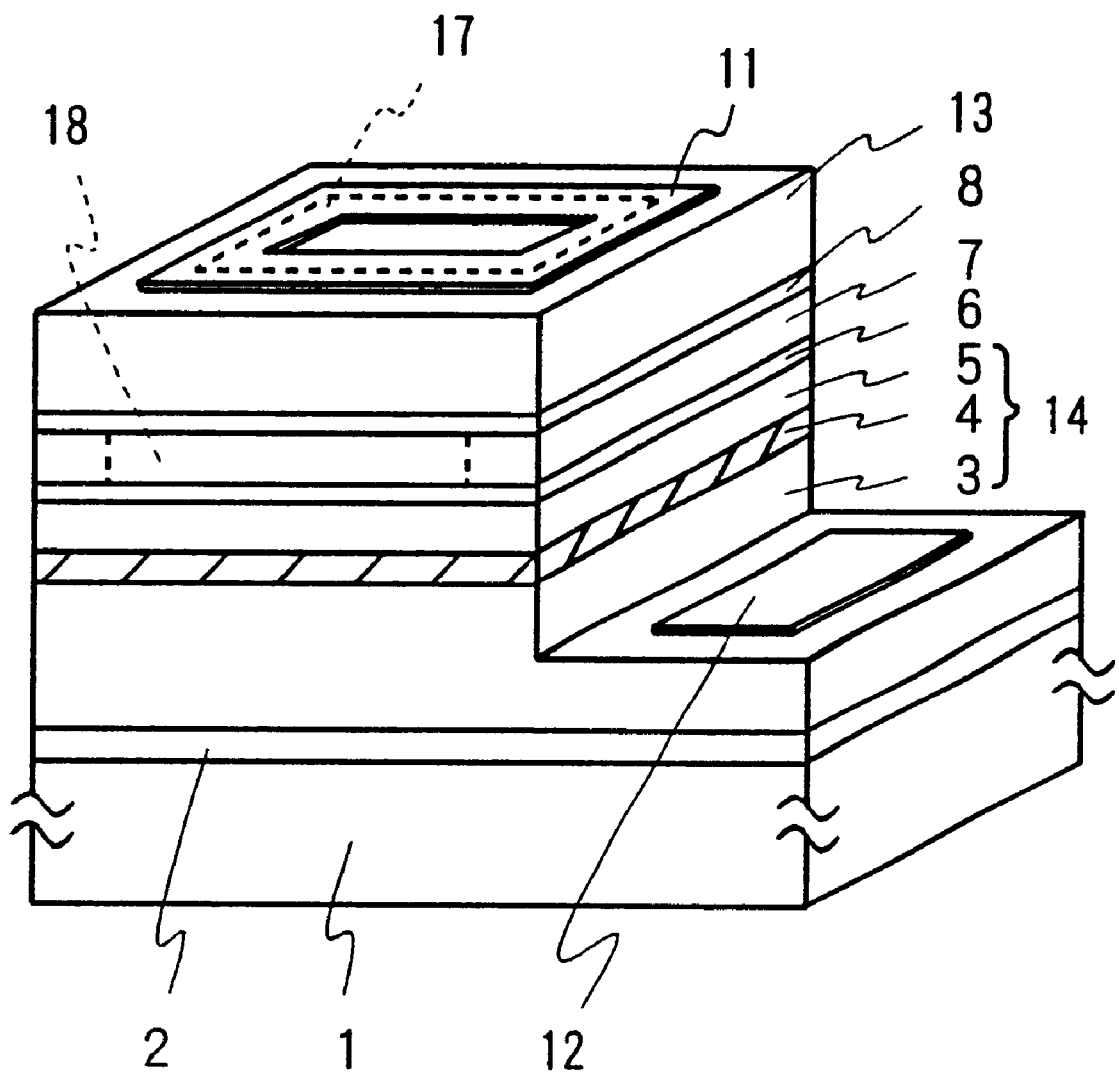
FIG. 2 is a perspective view for explaining a light-emitting diode according to one embodiment of the present invention.
Figure 4:
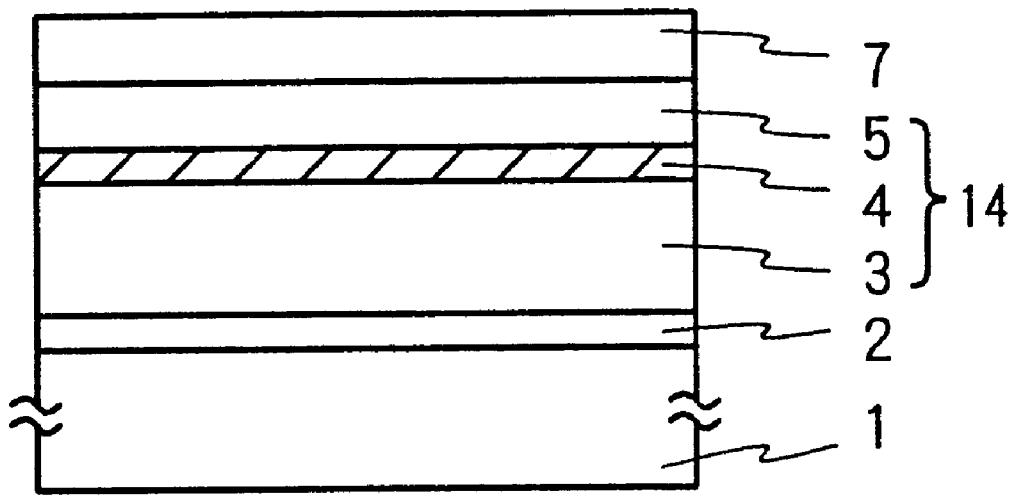
FIGS. 4(a) to (b) are diagrams for explaining the formation of a stripe in a semiconductor laser fabricated from GaN based compound semiconductors.
Figure 4:
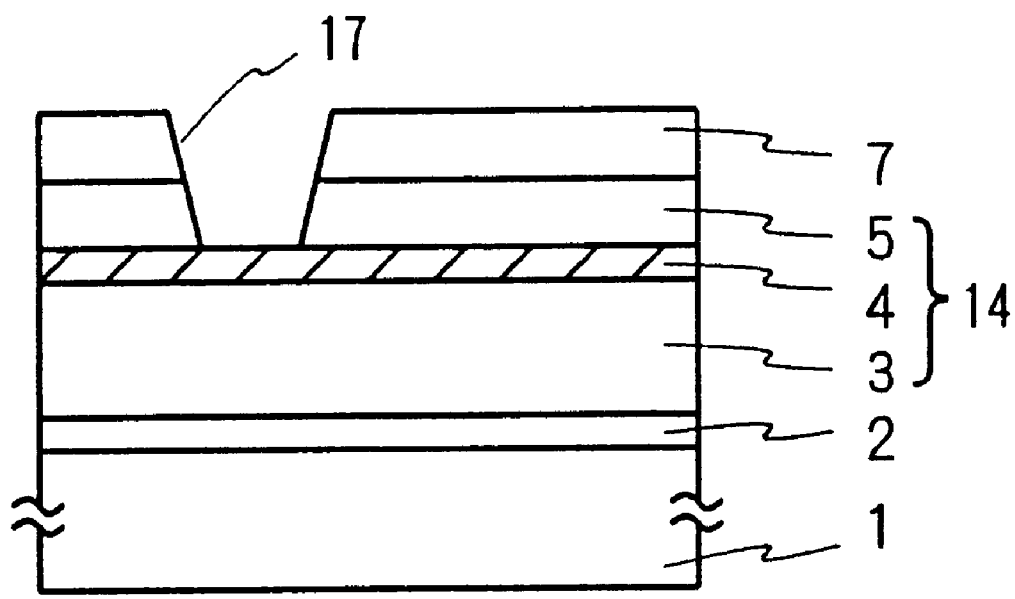

The above description has dealt with an example in which a stripe groove is formed in a semiconductor laser. On the other hand, if it is desired to partially etch semiconductor layers in a semiconductor light-emitting device fabricated from GaN based compound semiconductors, the present invention can also be applied to achieve precise etching and produce a semiconductor light-emitting device of excellent characteristics. FIG. 2 shows an example in which a current blocking layer is formed in a light-emitting diode fabricated from GaN based compound semiconductor layers.

FIG. 2 is a perspective view for explaining the light-emitting diode; the multiple semiconductor layer structure shown here is essentially the same as that of the semiconductor layer shown in FIG. 1(c), and the same semiconductor layers are designated by the same reference numerals. However, in the structure of FIG. 2, the light confinement layer is replaced by a current diffusing layer 13, and the contact layer is not provided. Further, the composition of the cladding layers 3 and 5 sandwiching the active layer 4 is different from that of the corresponding layers in the semiconductor laser, and the light confinement to the active layer 4 is made weaker. In the illustrated example, when a current flows over the entire chip surface, the current tends to leak into the edge faces of the chip, and wasted current increases; therefore, to prevent the current from flowing into the edge portions of the chip, the current blocking layer 7 is formed only around the periphery. More specifically, after the p-type cladding layer 5 is formed, the etching stop layer 6 of p-type $Al_aGa_{1-a}N$ (0.02≦a≦1), the current blocking layer 7 of n-type GaN, and the protective layer 8 of n- or p-type $Al_aGa_{1-a}N$ (0.02≦a≦1) are epitaxially grown one on top of another in the MOCVD equipment, after which a recessed portion 18 is formed by etching through the center of the protective layer 8 and current blocking layer 7. The current, therefore, is prevented by the current blocking layer 7 from flowing into the edge portions of the chip, the result being the formation of a semiconductor light-emitting device having little leakage current and having excellent emission characteristics.

For the etching of the current blocking layer 7, a portion of the current blocking layer 7 is first etched by dry etching, and then thermal etching is performed in the MOCVD equipment, in the same manner as previously described. In this process, etching stops at the etching stop layer 6, thus precisely etching only the current blocking layer 7 is performed without damaging the light-emitting layer forming portion 14. In the example shown in FIG. 2, the center portion of the p-side electrode 11 is removed for easy transmission of light; alternatively, the center portion of the electrode may be formed from a film thin enough to transmit light.

In another application example of the light-emitting diode, since the electrode on the light-emitting face side does not transmit light, light emission under that electrode is wasted. To address this problem, if the current blocking layer is formed by patterning under that electrode so that the current will not flow there, the emission efficiency can be improved. In this case also, the current blocking layer can be formed by patterning with good precision in close proximity to the light-emitting layer forming portion.

In each of the above examples, specific GaN based compound semiconductors such as GaN and $Al_{0.1}Ga_{0.9}N$ are used to form the semiconductor layers, but the semiconductor layers are not limited to these materials. It is also possible to use materials generally consisting of $Al_pGa_qIn_{1-p-q}N$ (0≦p≦1, 0<q≦1, 0<p+q≦1) with the p, q crystal mixing ratio so varied as to select such compositional proportions that make the bandgap energy of the active layer smaller than that of the cladding layers, for example. The present invention is also applicable for materials with all or part of the $Al_pGa_qIn_{1-p-q}N$ replaced by As and/or P, etc.

The above-described light-emitting diode has the structure in which the light-emitting layer is sandwiched between the cladding layers, but it is also possible to employ a conventional pn junction structure in which a p-type layer and an n-type layer are joined together.

According to the present invention, since the GaN based compound semiconductor layers can be etched by thermal etching in the conventional MOCVD equipment used for epitaxial growth of the GaN based compound semiconductor layers, by providing the etching stop layer only the desired semiconductor layers can be precisely etched.

As a result, the current blocking layer can be formed in close proximity to the light-emitting layer even in semiconductor light-emitting devices fabricated from GaN based compound semiconductors, and leakage current into regions outside the pattern can thus be reduced. Furthermore, since the current blocking layer can be formed in close proximity (0.1 to 1 μm) to the light-emitting layer, the overall thickness of the semiconductor layer structure can be reduced, thus reducing the overall resistance of the device. In this way, a semiconductor light-emitting device having high emission efficiency can be obtained.

Furthermore, in the case of the semiconductor laser, by changing the composition between the current blocking layer and the light confinement layer grown after etching, refractive index differences in lateral directions can be produced, thus achieving lateral light confinement and improving oscillation efficiency.

Although preferred embodiments have been described in some detail, it is to be understood that certain changes can be made by those skilled in the art without departing from the spirit and scope of the invention as defined by the appended claims.

What is claimed is:

1. A method of fabricating a semiconductor light-emitting device, comprising:

(a) epitaxially growing, one above another on a substrate, a light-emitting layer forming portion formed from a gallium nitride based compound semiconductor and including a semiconductor layer of a first conductivity type and a semiconductor layer of a second conductivity type, an etching stop layer of the second conductivity type formed from a gallium nitride based compound semiconductor containing Al, a current blocking layer of the first conductivity type formed from GaN, and a protective layer formed from a gallium nitride based compound semiconductor containing Al;

(b) etching said protective layer and said current blocking layer and thereby forming a recessed portion defining a light-emitting region through said protective layer and through a portion of said current blocking layer in a depthwise direction thereof;

(c) exposing said etching stop layer by thermally etching portions of said current blocking layer remaining in said recessed portion in an atmosphere containing hydrogen and ammonia gases in a growth furnace used for epitaxial growth of semiconductor layers;

(d) then epitaxially growing a semiconductor layer of the second conductivity type formed from a gallium nitride based compound semiconductor; and (e) forming electrodes electrically connected to said semiconductor layers of the first and second conductivity types, respectively.

2. A method of fabricating a semiconductor light-emitting device according to claim 1, wherein a nitrogen gas is added as an atmosphere gas during said thermal etching.

3. A method according to claim 1, wherein a second protective layer formed from GaN is formed on top of a surface of said protective layer, and said second protective layer is thermally etched during the thermal etching of said current blocking layer.

* * * * *